(12) United States Patent
Ohkubo et al.

(10) Patent No.: US 7,345,347 B2
(45) Date of Patent: Mar. 18, 2008

(54) SEMICONDUCTOR DEVICE

(75) Inventors: Hiroaki Ohkubo, Kanagawa (JP);
Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/261,613

(22) Filed: Oct. 31, 2005

(65) Prior Publication Data
US 2006/0102961 A1  May 18, 2006

(30) Foreign Application Priority Data
Nov. 17, 2004 (JP) ............................. 2004-332926

(51) Int. Cl.
*H01L 29/76* (2006.01)
(52) U.S. Cl. ...................... 257/371; 257/369; 257/555
(58) Field of Classification Search ................ 257/371, 257/369, 555
See application file for complete search history.

(56) References Cited

U.S. PATENT DOCUMENTS 6,472,716 B2 * 10/2002 Igaue et al. ................ 257/371

2006/0157818 A1 * 7/2006 Williams et al. ............ 257/511

FOREIGN PATENT DOCUMENTS

JP 05-190783 7/1993
JP 06-069436 3/1994

* cited by examiner

*Primary Examiner*—Evan Pert
*Assistant Examiner*—Tan Tran
(74) *Attorney, Agent, or Firm*—Young & Thompson

(57) ABSTRACT

At an element formation surface side of a p-type Si substrate, a digital circuit and an analog circuit are provided. The analog circuit includes a p-type well and n-type wells formed at the element formation surface side of the p-type Si substrate. The analog circuit includes a deep n-type well located closer to the bottom side of the p-type Si substrate than the p-type well, so as to isolate the p-type well from a bottom-side region of the p-type Si substrate. The deep n-type well includes a first deep n-type well. The deep n-type well includes a second deep n-type well located closer to the bottom side of the p-type Si substrate than the first deep n-type well, and having an n-type impurity concentration, which is different from the first deep n-type well.

7 Claims, 12 Drawing Sheets

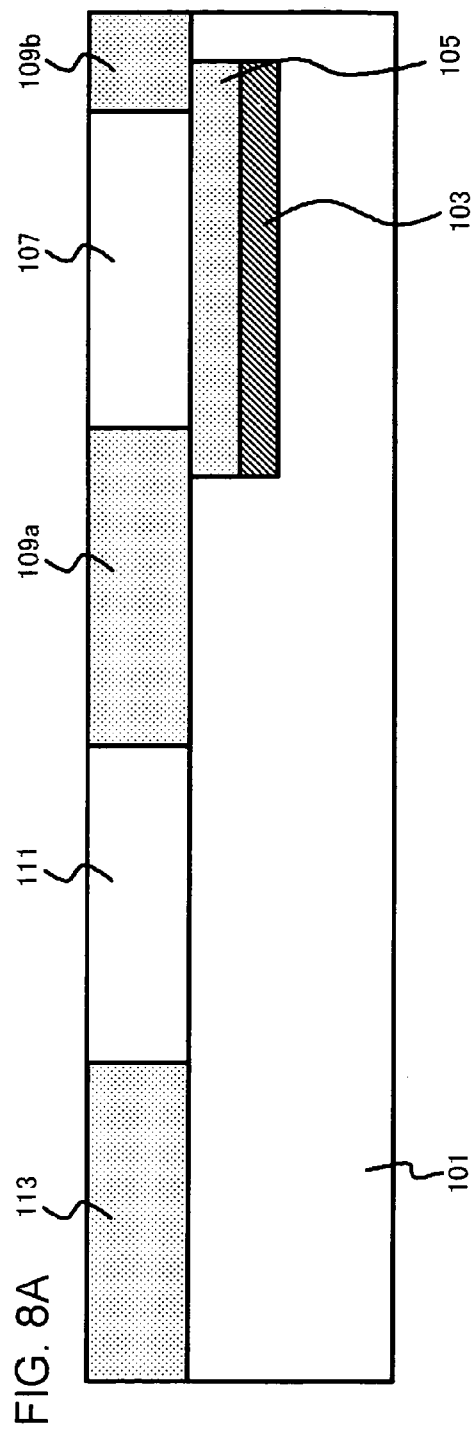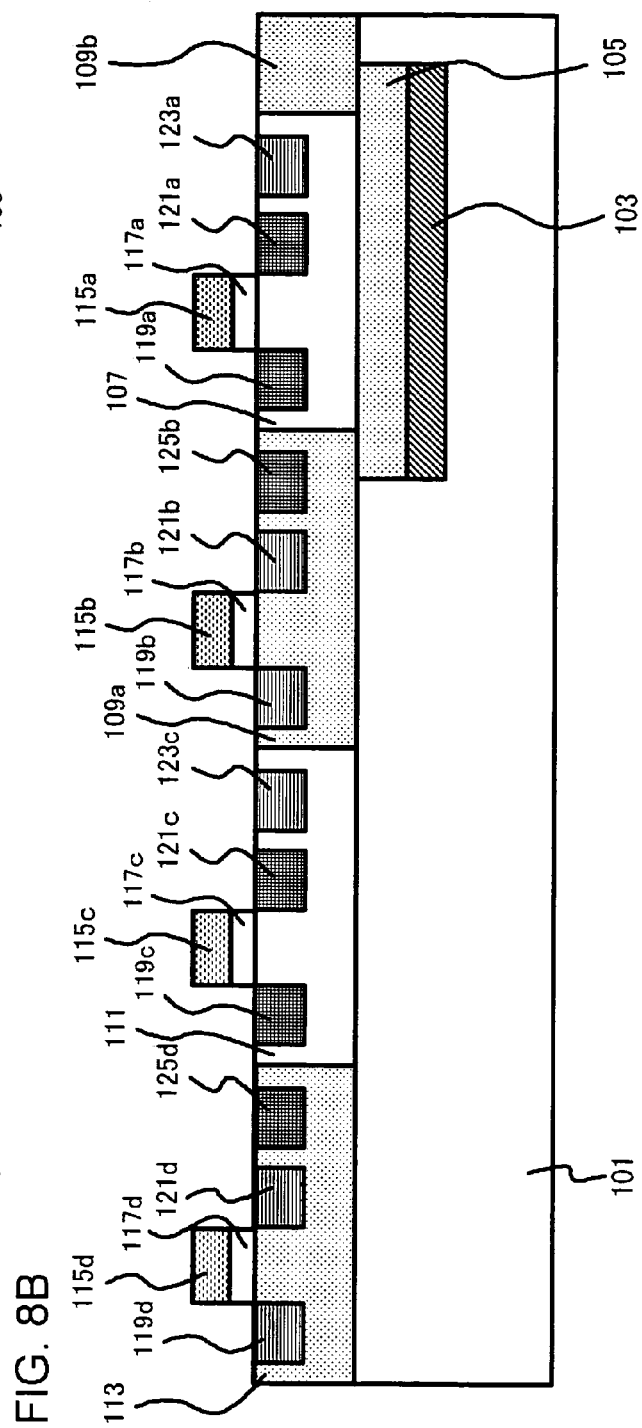

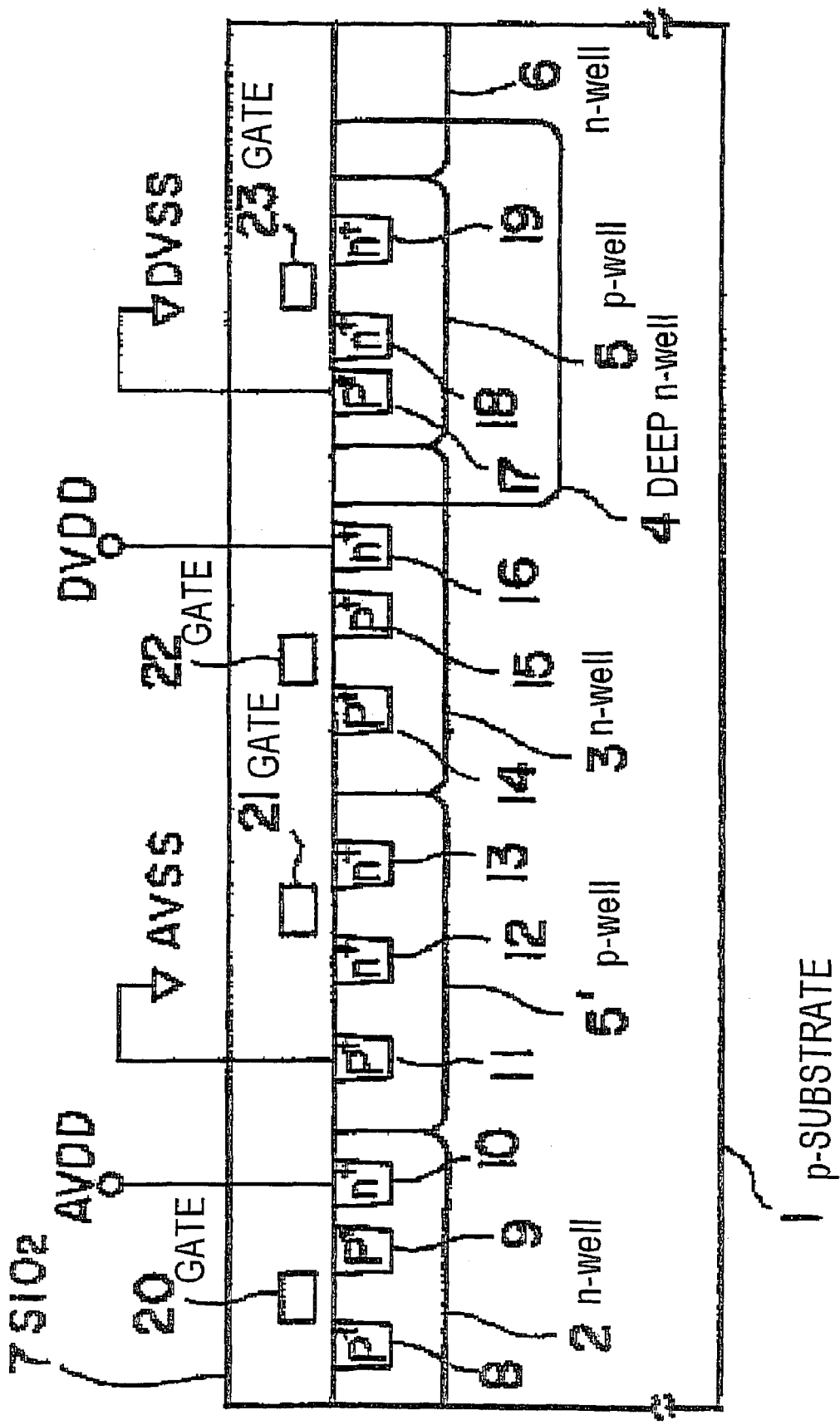

SEMICONDUCTOR DEVICE

This application is based on Japanese patent application No. 2004-332926, the content of which is incorporated hereinto by reference.

BACKGROUND OF THE INVENTION

1. Field of the Invention

The present invention relates to a semiconductor device.

2. Description of the Related Art

A semiconductor device to be herein discussed is found, for example, in Japanese Laid-open patent publication No. H05-190783. The semiconductor device disclosed in this document is shown in FIG. 11. This semiconductor device includes a deep well provided on the side of a digital circuit, to thereby adjust impurity concentration distribution.

As shown in FIG. 11, a p-substrate 1 includes selectively formed n-wells 2, 3, 6 and a deep n-well 4. The n-wells 3 and 6 are located so as to partially overlap the deep n-well 4. Also, the p-substrate 1 includes a p-well 5' and the deep n-well 4 includes a p-well 5.

Here, it is assumed that the digital circuit is constituted of a p-channel transistor formed in the n-well 3 and an n-channel transistor formed in the p-well 5. Likewise, it is assumed that an analog circuit is constituted of a p-channel transistor formed in the n-well 2 and an n-channel transistor formed in the p-well 5'. The potential of the n-well 3 including the p-channel transistor for the digital circuit is supplied by a digital positive power source DVDD, while the potential of the p-well 5 including the n-channel transistor for the digital circuit is supplied by a digital negative power source DVSS. The potential of the n-well 2 including the p-channel transistor for the analog circuit is supplied by an analog positive power source AVDD, while the potential of the p-well 5' including the n-channel transistor for the analog circuit is supplied by an analog negative power source AVSS.

Another semiconductor device to be herein discussed is found, for example, in Japanese Laid-open patent publication No. H06-69436. FIG. 12 shows the semiconductor device disclosed therein. This semiconductor device is of a similar structure to that disclosed in Japanese Laid-open patent publication No. H05-190783, except that a deep well is provided on the side of an analog circuit.

In the semiconductor devices according to the foregoing documents, however, when the plan-view area of the deep n-well 4 becomes larger, it becomes difficult to reduce a noise that intrudes into the analog circuit from the digital circuit. To be more detailed, impedance is usually defined by a formula:

$$Z=R+j(\omega L-1/\omega C).$$

Accordingly, an increase in the capacitance C (increase in the p-substrate 1-deep n-well 4 junction capacitance) leads to a decrease in the impedance Z. This inhibits reducing the noise that intrudes into the analog circuit from the digital circuit.

SUMMARY OF THE INVENTION

According to the present invention, there is provided a semiconductor device comprising:

a one-conductive semiconductor substrate;

a first element region formed at an element formation surface side of the semiconductor substrate; and a second element region formed at the element formation surface side of the semiconductor substrate;

wherein the first element region includes:

a one-conductive first region formed at the element formation surface side of the semiconductor substrate, a reverse-conductive second region formed at the element formation surface side of the semiconductor substrate, and a reverse-conductive third region formed closer to the bottom side of the semiconductor substrate than the first region, so as to isolate the first region from the a bottom-side region of the semiconductor substrate;

the third region or the first region includes:

a fourth region adjoining a region of a different conductive type, and a fifth region of the same conductive type as the fourth region, formed opposite to the region of a different conductive type from the fourth region; and an impurity concentration of the fourth region is lower than an impurity concentration of the fifth region.

With the semiconductor thus constructed, reducing the impurity concentration in the vicinity of an interface between the regions of different conductive types allows expansion of a depletion layer formed in the vicinity of the interface between the regions of different conductive types, thereby reducing the junction capacitance in the vicinity of the interface between the regions of different conductive types. This leads to an increase in impedance in the vicinity of one of such interfaces. Consequently, noise propagation through such interface is suppressed, and therefore the noise propagation between the first element region and the second element region is suppressed.

According to the present invention, there is provided a semiconductor device comprising:

a one-conductive semiconductor substrate;

a first element region formed at an element formation surface side of the semiconductor substrate; and a second element region formed at the element formation surface side of the semiconductor substrate;

wherein the first element region includes:

a one-conductive first region formed at the element formation surface side of the semiconductor substrate, a reverse-conductive second region formed at the element formation surface side of the semiconductor substrate, and a reverse-conductive third region formed closer to the bottom side of the semiconductor substrate than the first region, so as to isolate the first region from a bottom-side region of the semiconductor substrate; and the third region includes:

a reverse-conductive first lower region, and a reverse-conductive second lower region formed closer to the bottom side of the semiconductor substrate than the first lower region, and having a reverse-conductive impurity concentration different from the first lower region.

With the semiconductor thus constructed, reducing the impurity concentration in the vicinity of an interface between the regions of different conductive types allows the expansion of the depletion layer, formed in the vicinity of the interface between the regions of different conductive types, either the interface between the reverse-conductive first lower region and the one-conductive first region, or the interface between the reverse-conductive second lower region and the bottom-side region of one-conductive type of the semiconductor substrate. Accordingly, the junction capacitance in the vicinity of either of the interfaces can be reduced. This leads to an increase in impedance in the vicinity of such interface. Consequently, noise propagation through such interface is suppressed, and therefore the noise propagation between the first element region and the second element region is suppressed.

According to the present invention, there is provided a semiconductor device comprising:

a one-conductive semiconductor substrate;

a first element region formed at an element formation surface side of the semiconductor substrate; and a second element region formed at the element formation surface side of the semiconductor substrate;

wherein the first element region includes:

a one-conductive first region formed at the element formation surface side of the semiconductor substrate, a reverse-conductive second region formed at the element formation surface side of the semiconductor substrate, and a reverse-conductive third region formed closer to the bottom side of the semiconductor substrate than the first region, so as to isolate the first region from a bottom-side region of the semiconductor substrate; and the first region includes:

a one-conductive first upper region formed at the element formation surface side of the semiconductor substrate, and a one-conductive second upper region formed closer to the bottom side of the semiconductor substrate than the first upper region, and having a lower one-conductive impurity concentration than the first upper region.

With the semiconductor thus constructed, reducing the impurity concentration of the second upper region in the vicinity of the interface between the one-conductive second upper region and the reverse-conductive third region allows expansion of a depletion layer formed in the vicinity of such interface. Accordingly, the junction capacitance in the vicinity of this interface can be reduced. This leads to an increase in impedance in the vicinity of this interface. Consequently, noise propagation through such interface is suppressed, and therefore the noise propagation between the first element region and the second element region is suppressed.

It is to be noted that the expression of "closer to the bottom side of the semiconductor substrate" herein means relatively closer to the bottom side of the semiconductor substrate, and hence is not to be construed as defining a determined location.

In summary, the present invention provides a semiconductor device that suppresses noise propagation.

BRIEF DESCRIPTION OF THE DRAWINGS

The above and other objects, advantages and features of the present invention will be more apparent from the following description taken in conjunction with the accompanying drawings, in which:

FIGS. 8A and 8B are schematic cross-sectional drawings for explaining a manufacturing process of the semiconductor device according to the embodiment;

FIG. 11 is a schematic cross-sectional view showing a structure of a conventional semiconductor device.

DETAILED DESCRIPTION OF THE INVENTION

Figure 1:
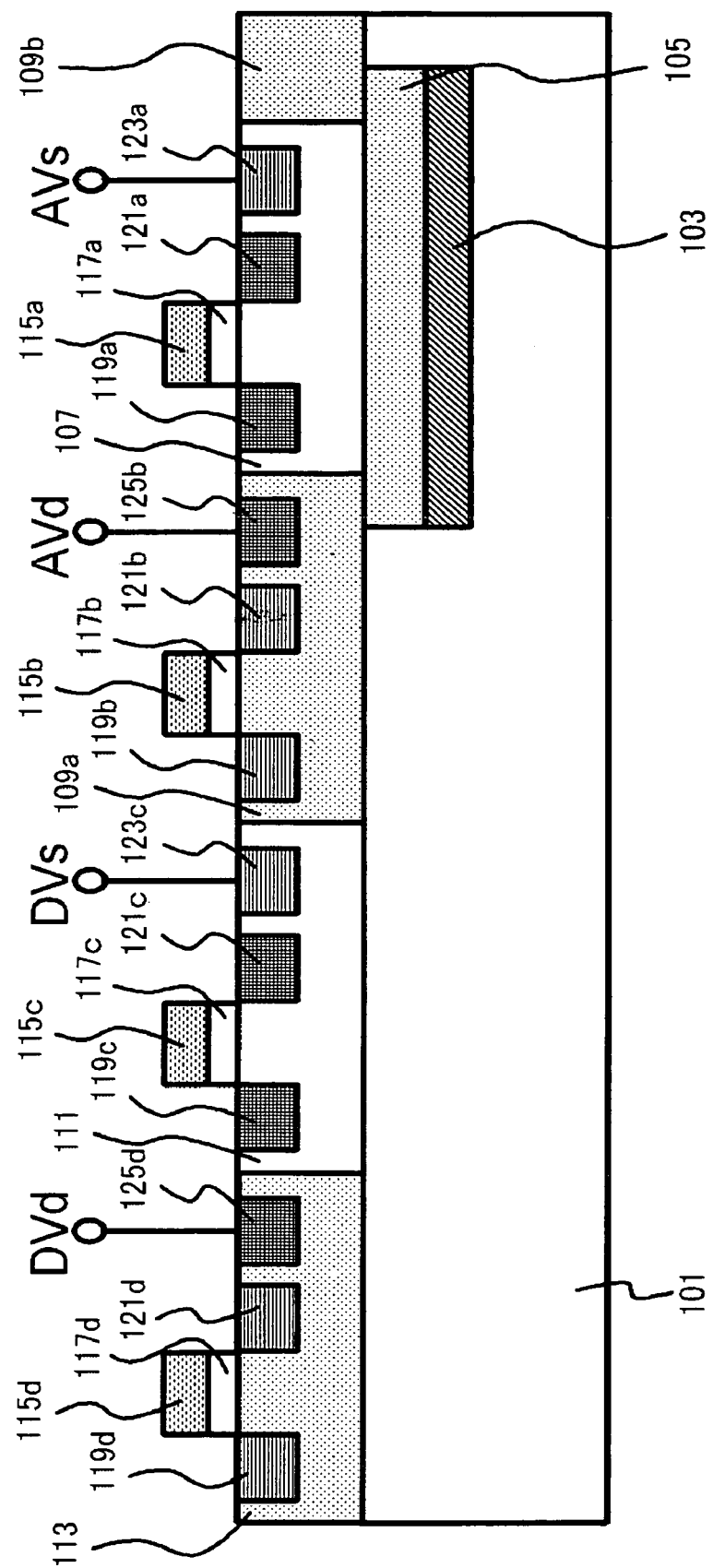
FIG. 1 is a schematic cross-sectional view showing a structure of a semiconductor device according to an embodiment of the present invention.

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

In the semiconductor device according to the present invention, the lower face of the second lower region may be joined to the bottom-side region of one-conductive type, and the impurity concentration of the second lower region may be lower than the impurity concentration of the first lower region.

With the semiconductor device thus constructed, reducing the impurity concentration of the second lower region in the vicinity of the interface between the reverse-conductive second lower region and the bottom-side region of one-conductive type allows the expansion of the depletion layer in the vicinity of the interface between the regions of different conductive types. Accordingly, the junction capacitance in the vicinity of this interface can be reduced. This leads to an increase in impedance in the vicinity of this interface. Consequently, noise propagation through such interface is suppressed, and therefore the noise propagation between the first element region and the second element region is suppressed.

In the semiconductor device according to the present invention, the upper face of the first lower region may be joined to the lower face of the first region, and the impurity concentration of the first lower region may be lower than the impurity concentration of the second lower region.

With the semiconductor device thus constructed, reducing the impurity concentration of the first lower region in the vicinity of the interface between the reverse-conductive first lower region and the one-conductive first region allows the expansion of the depletion layer in the vicinity of the interface between the regions of different conductive types. Accordingly, the junction capacitance in the vicinity of this interface can be reduced. This leads to an increase in impedance in the vicinity of this interface. Consequently, noise propagation through such interface is suppressed, and therefore the noise propagation between the first element region and the second element region is suppressed.

The semiconductor device according to the present invention may include a plurality of the second regions, and the upper face of the first lower region may be joined to the lower face of the plurality of the second regions.

With the semiconductor device thus constructed, since a plurality of the reverse-conductive second regions is electrically connected via the reverse-conductive first lower region, a potential can be supplied to the first lower region via the plurality of the reverse-conductive second regions.

In the semiconductor device according to the present invention, the second lower region may cover the lower and side faces of the first lower region.

With the semiconductor device thus constructed, since the second lower region is provided also on the side face of the first lower region, reducing the impurity concentration of the second lower region allows the expansion of the depletion layer formed in the vicinity of the interface between the regions of different conductive types, also on the side face of the third region. Accordingly, the junction capacitance in the vicinity of this interface between the regions of different conductive types can be reduced, also on the side face of the third region. This leads to an increase in impedance in the vicinity of the interface on the side face of the third region, thus enhancing the suppressing effect against the noise propagation.

In the semiconductor device according to the present invention, the first lower region or the second lower region may cover the lower face of the second region, and the impurity concentration of the first lower region or the second lower region may be lower than the impurity concentration of the second region.

With the semiconductor device thus constructed, since the first lower region or the second lower region is provided on the lower face of the second region, reducing the impurity concentration of the first lower region or the second lower region allows the expansion of the depletion layer formed in the vicinity of the interface between the regions of different conductive types, also on the lower face of the second region. Accordingly, the junction capacitance in the vicinity of this interface between the regions of different conductive types can be reduced, also on the lower face of the second region. This leads to an increase in impedance in the vicinity of the interface on the lower face of the second region, thus enhancing the suppressing effect against the noise propagation.

In the semiconductor device according to the present invention, the first element region may constitute at least a part of one of the digital circuit and the analog circuit, and the second element region may constitute at least a part of the other of the digital circuit and the analog circuit.

The semiconductor device thus constructed suppresses the noise propagation between the digital circuit and the analog circuit, when the semiconductor device is of a hybrid type including both digital and analog circuits.

Hereunder, embodiments of the present invention will be described referring to the accompanying drawings. With respect to all the drawings, similar constituents are given identical numerals, and description thereof will be omitted where appropriate.

First Embodiment

FIG. 1 is a schematic cross-sectional view showing a structure of a semiconductor device according to an embodiment of the present invention.

The semiconductor device according to this embodiment includes a p-type Si substrate 101 (one-conductive semiconductor substrate). At the element formation surface side of the p-type Si substrate 101 (upper side in FIG. 1), a digital circuit (a second element region) and an analog circuit (a first element region) are provided. In other words, the first element region constitutes at least a part of the analog circuit, and the second element region constitutes at least a part of the digital circuit.

The analog circuit includes a p-type well 107 (the one-conductive first region) formed at the element formation surface side of the p-type Si substrate 101. The analog circuit includes n-type wells 109a, 109b (the reverse-conductive second region) formed at the element formation surface side of the p-type Si substrate 101. The analog circuit includes a deep n-type well (the reverse-conductive third region), located closer to the bottom side of the p-type Si substrate 101 than the p-type well 107, so as to isolate the p-type well 107 from a bottom-side region of the p-type Si substrate 101.

The deep n-type well includes a first deep n-type well 105 (a reverse-conductive first lower region). The deep n-type well includes a second deep n-type well 103 (a reverse-conductive second lower region) located closer to the bottom side of the p-type Si substrate 101 than the first deep n-type well 105, and having an n-type (reverse-conductive) impurity concentration (such as phosphor), which is different from the first deep n-type well 105.

The lower face of the second deep n-type well 103 is joined to the bottom-side region of one-conductive type. The impurity concentration of the second deep n-type well 103 is lower than the impurity concentration of the first deep n-type well 105. The n-type wells 109a, 109b are provided in a plurality of numbers. The upper face of the first deep n-type well 105 is joined to the lower face of the plurality of the n-type wells 109a, 109b.

On the p-type well 107, an n-MOS transistor is provided. The n-channel transistor on the p-type well 107 includes a gate electrode 115a constituted of a polysilicon film, a gate insulating film 117a constituted of a silicon oxide film, and n+ diffusion regions 119a, 121a that serve as a source electrode and a drain electrode. In the p-type well 107, a p-type well contact 123a, which has a higher p-type impurity concentration than the p-type well 107, is provided. The p-type well contact 123a is electrically connected to the analog negative power source AVs.

On the n-type well 109a, a p-MOS transistor is provided. The p-MOS transistor on the n-type well 109a includes a gate electrode 115b constituted of a polysilicon film, a gate insulating film 117b constituted of a silicon oxide film, and p+ diffusion regions 119b, 121b that serve as a source electrode and a drain electrode. In the n-type well 109a, an n-type well contact 125b, which has a higher n-type impurity concentration than the n-type well 109a, is provided. The n-type well contact 125b is electrically connected to the analog positive power source AVd.

On the p-type well 111, an n-MOS transistor is provided. The n-channel transistor on the p-type well 111 includes a gate electrode 115c constituted of a polysilicon film, a gate insulating film 117c constituted of a silicon oxide film, and n$^+$ diffusion regions 119c, 121c that serve as a source electrode and a drain electrode. In the p-type well 111, a p-type well contact 123c, which has a higher p-type impurity concentration than the p-type well 111, is provided. The p-type well contact 123c is electrically connected to the digital negative power source DVs.

On the n-type well 113, a p-MOS transistor is provided. The p-MOS transistor on the n-type well 113 includes a gate electrode 115d constituted of a polysilicon layer, a gate insulating layer 117d constituted of a silicon oxide layer, and p$^+$ diffusion regions 119d, 121d that serve as a source electrode and a drain electrode. On the n-type well 113, an n-type well contact 125d, which has a higher n-type impurity concentration than the n-type well 113, is provided. The n-type well contact 125*d* is electrically connected to the digital positive power source DVd.

Here, a potential applied to the respective wells by the digital positive power source DVd, the digital negative power source DVs, the analog positive power source AVd and the analog negative power source AVs is independently controlled. The n-type wells 109*a*, 109*b* are maintained equipotential via the first deep n-type well 105.

The following passages cover an operation of the semiconductor device according to this embodiment.

In this embodiment, a main power source (not shown) is provided outside of the semiconductor device, and the main power source voltage is set at 1.0V. To the main power source, four voltage regulators (not shown) are connected, each of which can be independently controlled. Accordingly, the main power source is connected to the digital positive power source DVd, the digital negative power source DVs, the analog positive power source AVd and the analog negative power source AVs, via the four independently controllable voltage regulators respectively.

The digital negative power source DVs and the analog negative power source AVs independently apply a voltage (Vpdw, Vpaw) of a desired value within a range of 0 to −2.0V, to the p-type well contact 123*c* and the p-type well contact 123*a* respectively. The digital positive power source DVd and the analog positive power source AVd independently apply a voltage (Vndw, Vnaw) of a desired value within a range of 1.0V to 3.0V, to the n-type well contacts 125*d*, 125*b* respectively.

At this stage, the voltage applied to the n-type well contact 125*b* (Vnaw) is also applied to the n-type well 109*b* via the n-type well 109*a* and the first deep n-type well 105. Since the potential applied to the respective wells by the digital positive power source DVd, the digital negative power source DVs, the analog positive power source AVd and the analog negative power source AVs can be independently controlled, a threshold value for the gate electrodes of the transistors provided on the p-type wells 111, 107 and the n-type well 113, 109*a* can also be independently controlled.

The passages here below cover a manufacturing process of the semiconductor device according to this embodiment. It is to be noted that the following manufacturing process is only exemplary and that the manufacturing process of the semiconductor device according to this embodiment is not limited to the following.

Figure 7A:
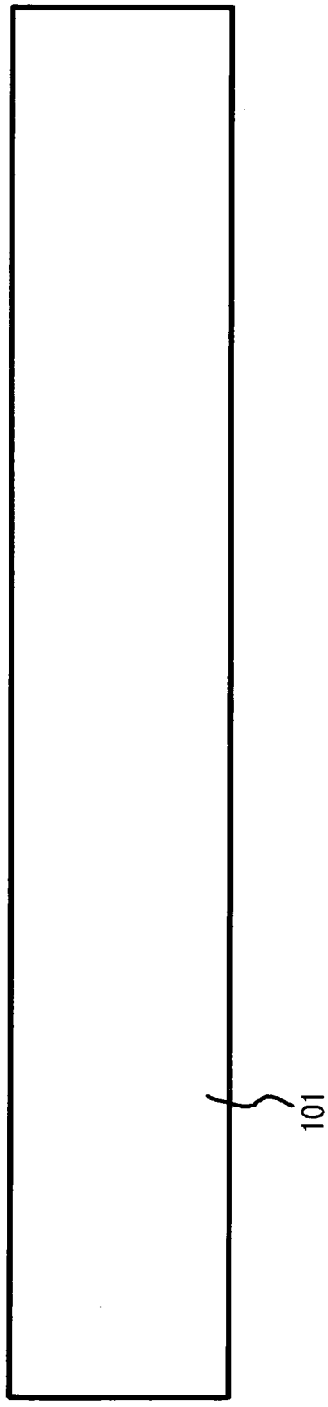
FIGS. 7A and 7B are schematic cross-sectional drawings for explaining a manufacturing process of the semiconductor device according to the embodiment.
Figure 7B:
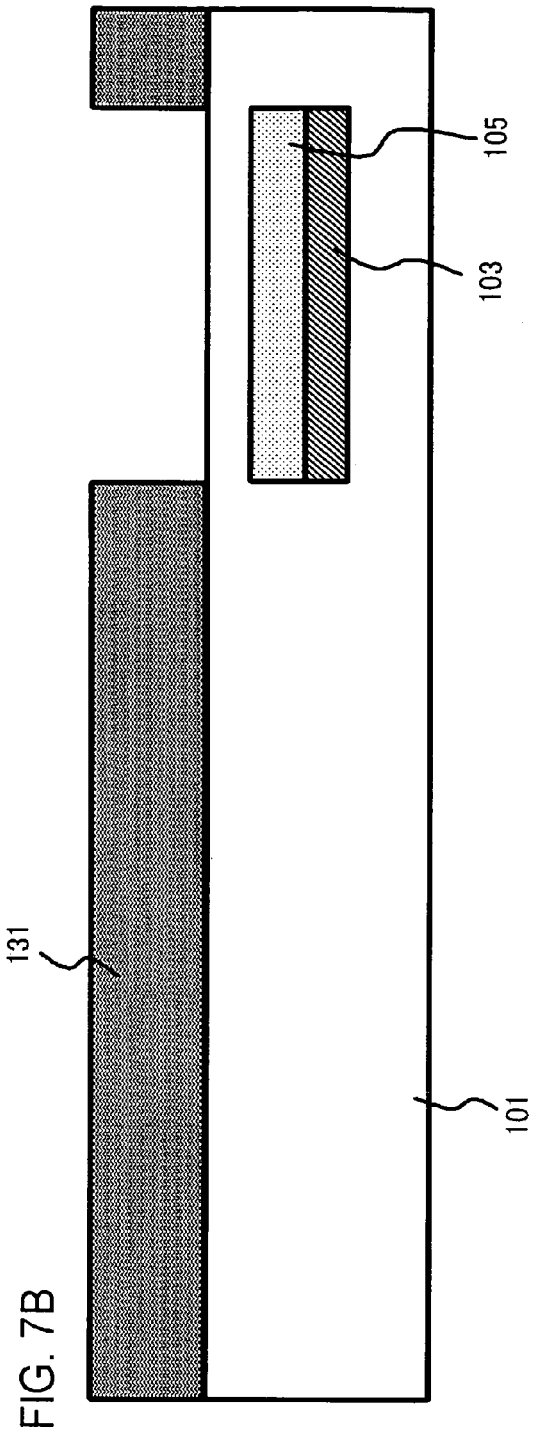

FIGS. 7A and 7B are schematic cross-sectional drawings for explaining a manufacturing process of the semiconductor device according to this embodiment.

Referring first to FIG. 7A, the p-type Si substrate 101 is prepared. Although the p-type Si substrate 101 is provided with a predetermined element isolation region formed on its the element formation surface through a known process, such region is not shown for the sake of explicitness of the drawings. The element isolation region is provided in a form of a shallow trench isolation (STI), through forming a shallow trench on a predetermined region of the element formation surface of the p-type Si substrate 101 with a mask (not shown), and filling the trench with various materials, after burying an insulating material in the trench or forming an insulating film on the inner wall of the trench.

Then referring to FIG. 7B, two steps of ion implantation of an N-type impurity are performed utilizing a photoresist mask 131 made by patterning a photoresist applied to the element formation surface of the p-type Si substrate 101, so as to form the first deep n-type well 105 and the second deep n-type well 103. To be more detailed, phosphor is implanted via the photoresist mask 131 at en energy of 500 keV to 2 MeV and in a density of $1\times10^{13}$ cm$^{-2}$ to $5\times10^{13}$ cm$^{-2}$, so as to form the second deep n-type well 103 in a region of a predetermined depth from the element formation surface. This is followed by phosphor implantation via the photoresist mask 131 at an energy of 100 keV to 1 MeV and in a density of $1\times10^{13}$ cm$^{-2}$ to $5\times10^{13}$ cm$^{-2}$, so as to form the first n-type well 105 on top of the second deep n-type well 103.

FIGS. 8A and 8B are schematic cross-sectional drawings for explaining a manufacturing process of the semiconductor device according to this embodiment.

Referring now to FIG. 8A, the photoresist mask 131 is removed, and ion implantation of for example phosphor is performed under the conditions of 100 keV to 1 MeV and $1\times10^{13}$ cm$^{-2}$ to $5\times10^{13}$ cm$^{-2}$, utilizing a photoresist mask newly made by patterning a photoresist applied to the element formation surface of the p-type Si substrate 101, so as to form the n-type wells 113, 109*a*, 109*b* on top of the first deep n-type well 105. The n-type wells 113, 109*a*, 109*b* are located under a region where the p-MOS transistor, which will be subsequently described, is to be provided.

Then the photoresist mask (not shown) is removed, and ion implantation of for example boron is performed under the conditions of 50 keV to 500 keV and $1\times10^{13}$ cm$^{-2}$ to $5\times10^{13}$ cm$^{-2}$, utilizing a photoresist mask newly made by patterning a photoresist applied to the element formation surface of the p-type Si substrate 101, so as to form the p-type wells 111, 107. The p-type wells 111, 107 are located under a region where the n-MOS transistor, which will be subsequently described, is to be provided.

Proceeding to FIG. 8B, the photoresist mask (not shown) is removed, and the gate insulating films 117*a*, 117*b*, 117*c*, 117*d* constituted of a silicon oxide film are formed through a known process on the element formation surface in a region where the n-MOS transistor and the p-MOS transistor, which will be subsequently described, are to be provided. On the gate insulating films 117*a*, 117*b*, 117*c*, 117*d*, the gate electrodes 115*a*, 115*b*, 115*c*, 115*d* constituted of a polysilicon film are formed (the sidewall is not shown). To be more detailed, a multilayered film of a silicon oxide film and a polysilicon film is formed on the element formation surface of the p-type Si substrate 101, and a selective etching and patterning are performed with a photoresist mask (not shown), so as to form the gate insulating films 117*a*, 117*b*, 117*c*, 117*d* and the gate electrodes 115*a*, 115*b*, 115*c*, 115*d*.

Then, ion implantation of for example arsenic (As) is performed under the conditions of 10 keV to 50 keV and $1\times10^{15}$ cm$^{-2}$ to $1\times10^{16}$ cm$^{-2}$ into the p-type wells 107, 111 with the region for the p-MOS transistor (region for then-type wells 113, 109*a*, 109*b*) covered with a photoresist mask (not shown), so as to form the n$^+$ diffusion regions 119*a*, 121*a*, 119*c*, 121*c* that serve as a source electrode and a drain electrode for the n-MOS transistor. At this stage, the photoresist mask (not shown) is provided with an opening at positions corresponding to the n-type well contacts 125*b*, 125*d*. Accordingly, the n-type well contacts 125*b*, 125*d* are formed in the n-type wells 109*a*, 113.

The above is followed by ion implantation of for example boron (B) under the conditions of 1 keV to 5 keV and $1\times10^{15}$ cm$^{-2}$ to $1\times10^{16}$ cm$^{-2}$ into the n-type wells 109*a*, 109*b*, 113 with the region for the n-MOS transistor (region for the p-type wells 107, 111) covered with a photoresist mask (not shown), so as to form the p$^+$ diffusion regions 119*b*, 121*b*, 119*d*, 121*d* that serve as a source electrode and a drain electrode for the p-MOS transistor. At this stage, the photoresist mask (not shown) is provided with an opening at positions corresponding to the p-type well contacts 123*a*, 123c. Accordingly, the p-type well contacts 123a, 123c are formed in the p-type well 107, 111.

Further as shown in FIG. 1, the analog negative electrode AVs and the digital negative electrode DVs are formed on the p-type well contacts 123a, 123c respectively. Likewise, the analog positive electrode AVd and the digital positive electrode DVd are formed on the n-type well contacts 125b, 125d respectively. Thereafter, performing the foregoing manufacturing process provides the semiconductor device according to this embodiment.

The advantageous effect of the semiconductor device according to this embodiment will now be described hereunder.

The semiconductor device according to this embodiment suppresses the noise propagation between the digital circuit and the analog circuit. To be more detailed, reducing the n-type impurity concentration of the second deep n-type well 103 in the vicinity of the interface between the second deep n-type well 103 and the p-type bottom-side region of the p-type Si substrate 101 allows the expansion of the depletion layer in the vicinity of this interface, and hence the junction capacitance in the vicinity of the interface can be reduced. This leads to an increase in impedance in the vicinity of the interface. Consequently, the noise propagation via this interface is suppressed. Moreover, even when the area of the first deep n-type well 105 and the second deep n-type well 103 (the analog circuit to be protected) becomes larger, the noise can be inhibited from intruding into the analog circuit from the digital circuit.

In the semiconductor device according to this embodiment, the first deep n-type well 105 receives a potential via the n-type wells 109a, 109b. Here, the n-type wells 109a, 109b are located along an upper face of an outer periphery of the first deep n-type well 105, and are connecting in a plan view. The n-type wells 109a, 109b may be formed for example in a ring shape along the upper face of the outer periphery of the first deep n-type well 105. Also, since the upper face of the first deep n-type well 105 is in contact with the lower face of the n-type wells 109a, 109b, the first deep n-type well 105 can stably receive a potential via both of the n-type wells 109a, 109b.

Figure 10A:
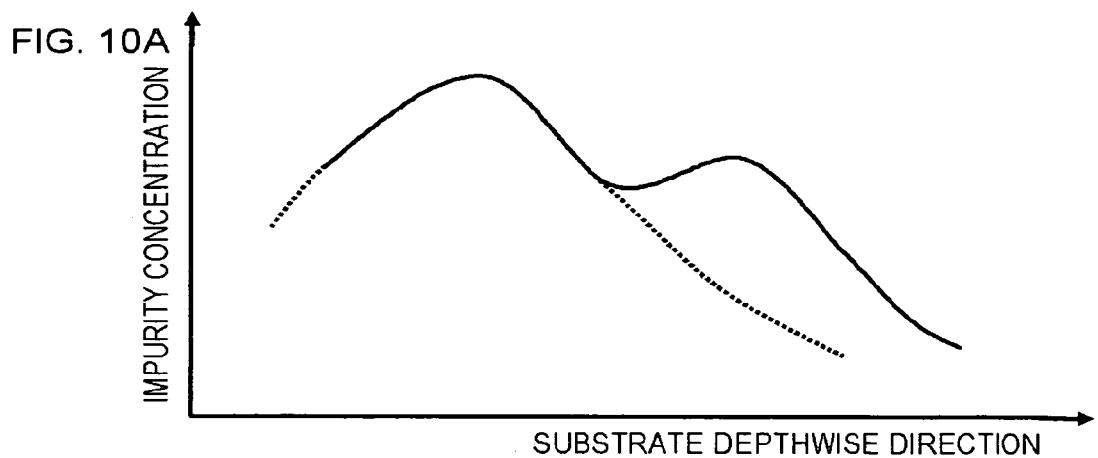
FIGS. 10A to 10C are line graphs showing impurity concentration profiles of a deep n-type well in the semiconductor device according to the embodiment.
Figure 10B:
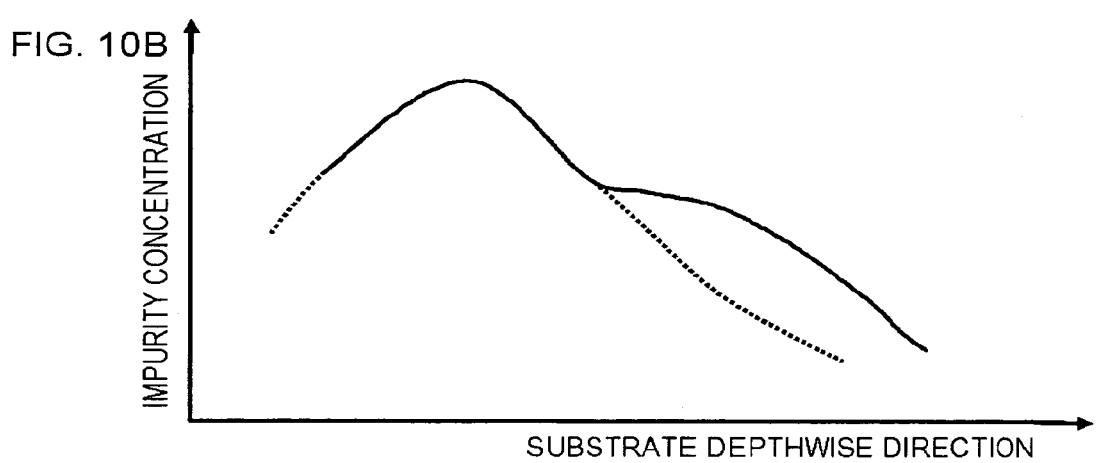
Figure 10C:
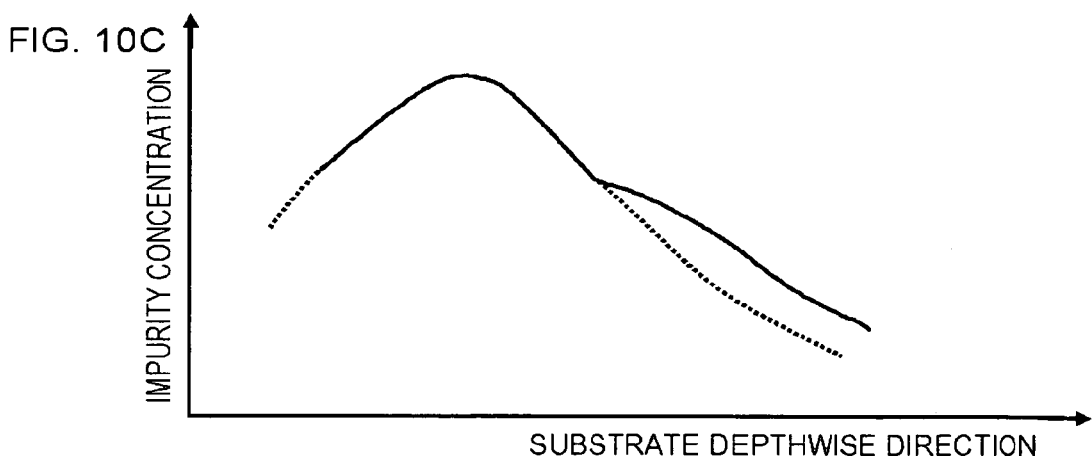
Figure 12:
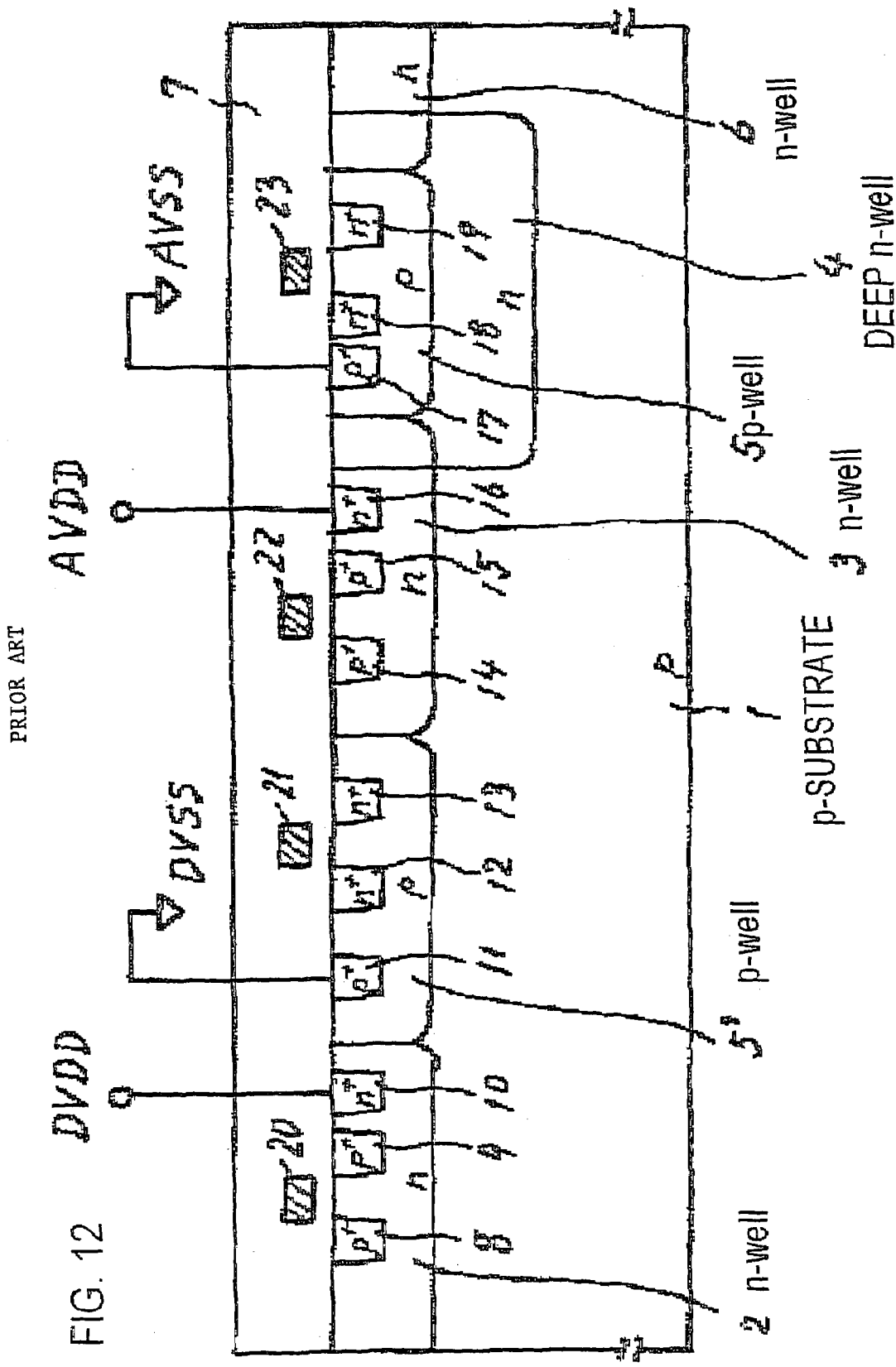
FIG. 12 is a schematic cross-sectional view showing a structure of another conventional semiconductor device.

FIGS. 10A to 10C are line graphs showing impurity concentration profiles of a deep n-type well in the semiconductor device according to the embodiment. While the first deep n-type well 105 and the second deep n-type well 103 are clearly distinguished in this embodiment for simplifying the description on the structure of the semiconductor device, the present invention is not specifically limited to such structure. Practically, the deep n-type well is construed to include the first deep n-type well 105 and the second deep n-type well 103, provided that the n-type impurity concentration profile of the deep n-type well includes two or more peaks of the n-type impurity concentration in a direction of the normal of the element formation surface of the p-type Si substrate 101 (depth wise direction of the substrate) as shown in FIG. 10A.

In addition, the deep n-type well is construed to include the first deep n-type well 105 and the second deep n-type well 103, provided that the n-type impurity concentration profile of the deep n-type well includes one or more peak of the n-type impurity concentration in a direction of the normal of the element formation surface of the p-type Si substrate 101 (depth wise direction of the substrate) and also includes a distribution curve having a shoulder portion (flat portion) that is shifted from the ordinary one-peak distribution curve of the n-type impurity concentration, as shown in FIG. 10B or 10C.

In the case where a deep n-type well 905 in the reference example to be subsequently described is constituted of a single layer, the n-type impurity concentration profile of the deep n-type well only presents the peak on the left in FIG. 10. In contrast, according to this embodiment the n-type impurity concentration profile includes another peak of a lower concentration or a shoulder portion (flat portion) at a deeper location.

Second Embodiment

Figure 2:
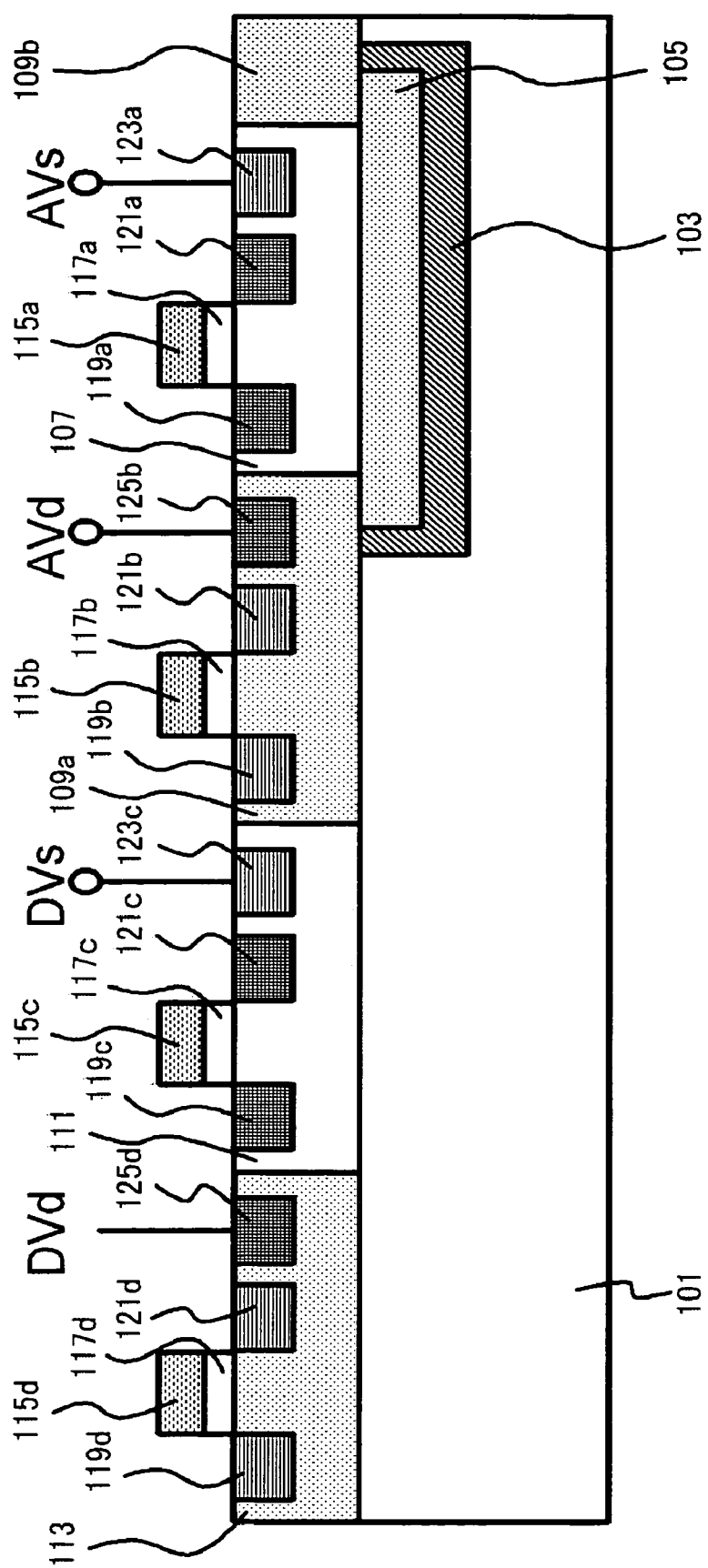
FIG. 2 is a schematic cross-sectional view showing a structure of a semiconductor device according to another embodiment of the present invention.

FIG. 2 is a schematic cross-sectional view showing a structure of a semiconductor device according to this embodiment.

The semiconductor device according to this embodiment has a similar structure to that of the first embodiment, with the following additions. The constituents similar to those in the first embodiment are given the same numerals, and the description thereof will be omitted where appropriate.

In this embodiment, the second deep n-type well 103 covers the lower and side faces of the first deep n-type well 105. Also, the n-type impurity concentration of the second deep n-type well 103 is lower than the n-type impurity concentration of the first deep n-type well 105.

The following passages cover the advantageous effect of the semiconductor device according to this embodiment.

The semiconductor device according to this embodiment provides the following benefits, in addition to those provided by the semiconductor device of the first embodiment.

The semiconductor device according to this embodiment more effectively suppresses the noise propagation between the digital circuit and the analog circuit. To be more detailed, since the second deep n-type well 103 is provided also on the side face of the first deep n-type well 105, the depletion layer formed in the vicinity of the interface between the regions of different conductive types can be expanded on the side face of the double deep n-type wells, in addition to the lower face thereof. Therefore, the junction capacitance in the vicinity of the interface between the regions of different conductive types can be reduced, also on the side face of the double deep n-type wells. This leads to an increase in impedance in the vicinity of such interface. Consequently, the noise propagation via the interface between the regions of different conductive types is suppressed also on the side face of the double deep n-type wells, which enhances the suppressing effect against the noise propagation between the digital circuit and the analog circuit.

Third Embodiment

Figure 3:
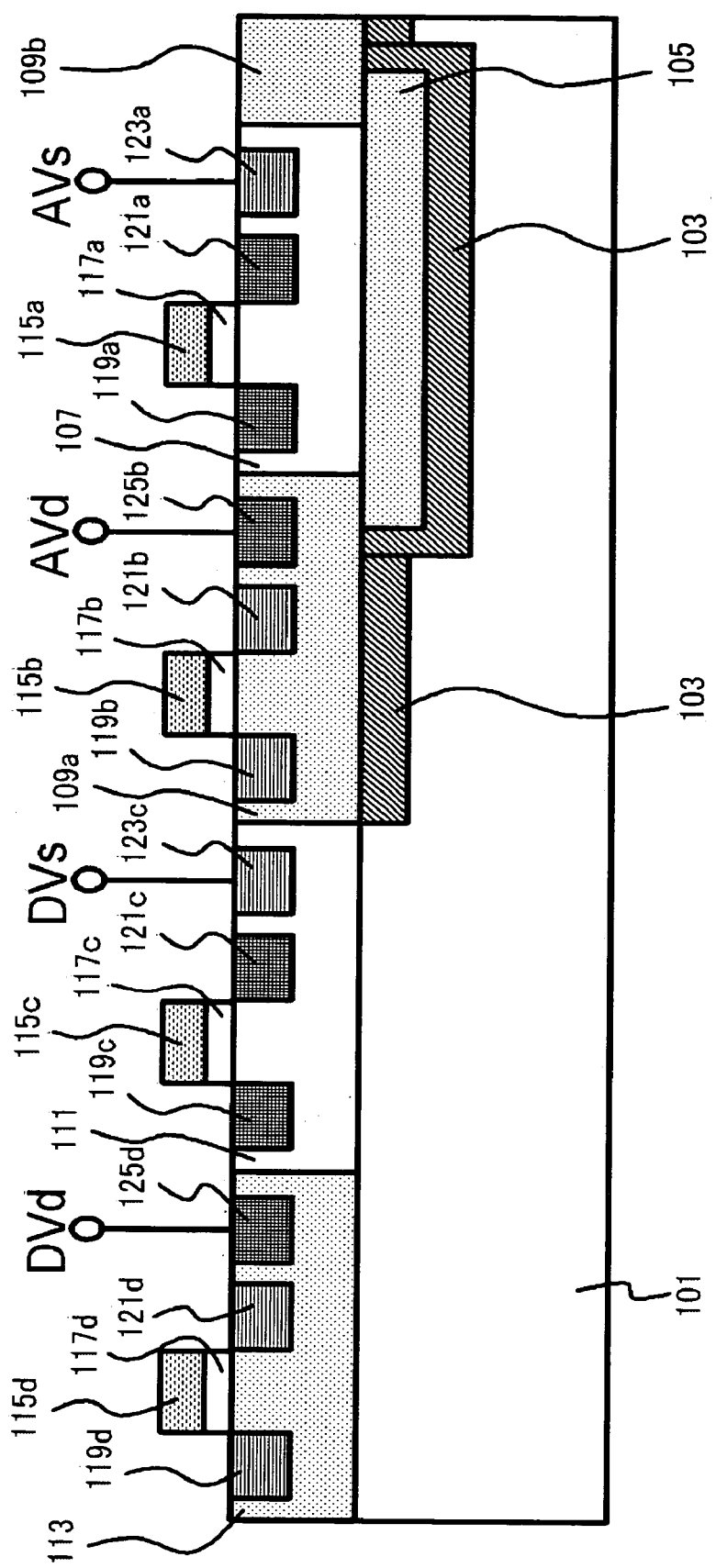
FIG. 3 is a schematic cross-sectional view showing a structure of a semiconductor device according to still another embodiment of the present invention.

FIG. 3 is a schematic cross-sectional view showing a structure of a semiconductor device according to this embodiment.

The semiconductor device according to this embodiment has a similar structure to that of the first embodiment, with the following additions. The constituents similar to those in the first embodiment are given the same numerals, and the description thereof will be omitted where appropriate.

In this embodiment, the first deep n-type well 105 or the second deep n-type well 103 covers the lower face of the n-type wells 109a, 109b. Also, the impurity concentration of the first deep n-type well 105 or the second deep n-type well 103 is lower than the impurity concentration of the n-type wells 109a, 109b.

The following passages cover the advantageous effect of the semiconductor device according to this embodiment.

The semiconductor device according to this embodiment provides the following benefits, in addition to those provided by the semiconductor device of the first embodiment.

The semiconductor device according to this embodiment more effectively suppresses the noise propagation between the digital circuit and the analog circuit. To be more detailed, since the first deep n-type well 105 or the second deep n-type well 103 is provided also on the lower face of the n-type wells 109a, 109b, and the impurity concentration of the first deep n-type well 105 or the second deep n-type well 103 is lower than the impurity concentration of the n-type wells 109a, 109b, the depletion layer formed in the vicinity of the interface between the regions of different conductive types can be expanded also on the lower face of the n-type wells 109a, 109b. Therefore, the junction capacitance in the vicinity of the interface between the regions of different conductive types can be reduced, also on the lower face of the n-type wells 109a, 109b. This leads to an increase in impedance in the vicinity of such interface. Consequently, the noise propagation via the interface between the regions of different conductive types is suppressed on the lower face of the n-type wells 109a, 109b, which enhances the suppressing effect against the noise propagation between the digital circuit and the analog circuit.

Fourth Embodiment

Figure 4:
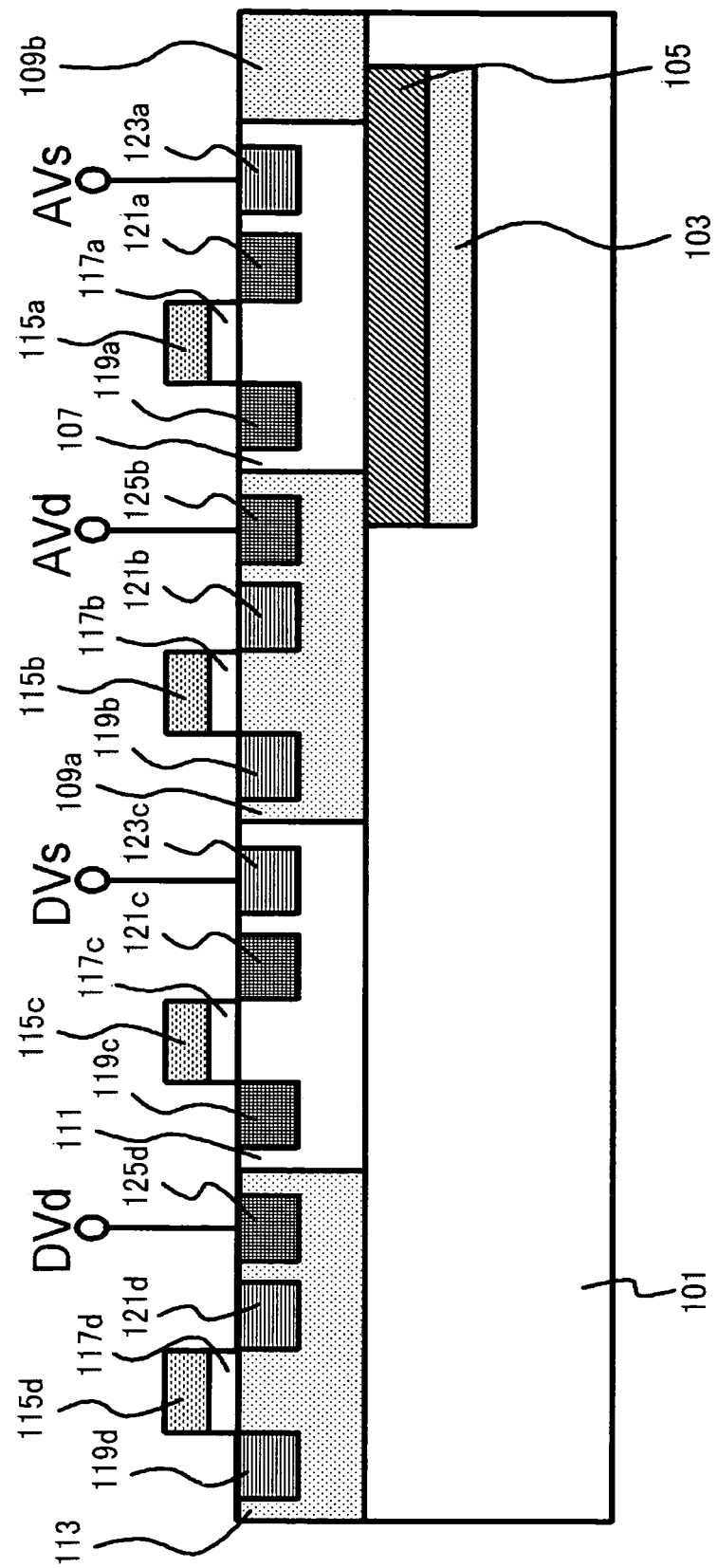
FIG. 4 is a schematic cross-sectional view showing a structure of a semiconductor device according to still another embodiment of the present invention.

FIG. 4 is a schematic cross-sectional view showing a structure of a semiconductor device according to this embodiment.

The semiconductor device according to this embodiment has a different structure from that of the first embodiment, in the following aspects. The constituents similar to those in the first embodiment are given the same numerals, and the description thereof will be omitted where appropriate.

In the semiconductor device according to this embodiment, the upper face of the first deep n-type well 105 (the fourth region) in the deep n-type well (the third region) is joined to the lower face of the p-type well 107, and the n-type impurity concentration of the first deep n-type well 105 is lower than the n-type impurity concentration of the second deep n-type well 103 (the fifth region).

The second deep n-type well 103 (the fifth region) is located opposite to the p-type well 107 across the first deep n-type well 105 (the fourth region).

The following passages cover the advantageous effect of the semiconductor device according to this embodiment.

The semiconductor device according to this embodiment provides the following benefits.

The semiconductor device according to this embodiment suppresses the noise propagation between the digital circuit and the analog circuit. To be more detailed, since the n-type impurity concentration of the first deep n-type well 105 in the vicinity of the interface between the first deep n-type well 105 and the p-type well 107 is lower than the n-type impurity concentration of the second deep n-type well 103, the depletion layer formed in the vicinity of the interface between the regions of different conductive types can be expanded. Therefore, the junction capacitance in the vicinity of this interface can be reduced. This leads to an increase in impedance in the vicinity of this interface. Consequently, the noise propagation via this interface is suppressed, which results in suppressing the noise propagation between the digital circuit and the analog circuit.

In the semiconductor device according to this embodiment, further, the second deep n-type well 103 receives a potential via the n-type wells 109a, 109b. Here, the n-type wells 109a, 109b are located along an upper face of an outer periphery of the first deep n-type well 105, and are connecting in a plan view. The n-type wells 109a, 109b may be formed for example in a ring shape along the upper face of the outer periphery of the first deep n-type well 105. In other words, the upper face of the second deep n-type well 103 is in contact with the lower face of the n-type wells 109a, 109b via a minute gap. Also, it is the first deep n-type well 105 having a lower n-type impurity concentration that constitutes the gap between the second deep n-type well 103 and the n-type wells 109a, 109b. Accordingly, the n-type wells 109a, 109b are electrically connected via the gap constituted of the first deep n-type well 105 and via the second deep n-type well 103, i.e. via a path that barely has a resistance. Consequently, the potential is barely varied, and hence the second deep n-type well 103 can stably receive a potential via both of the n-type wells 109a, 109b.

Fifth Embodiment

Figure 5:
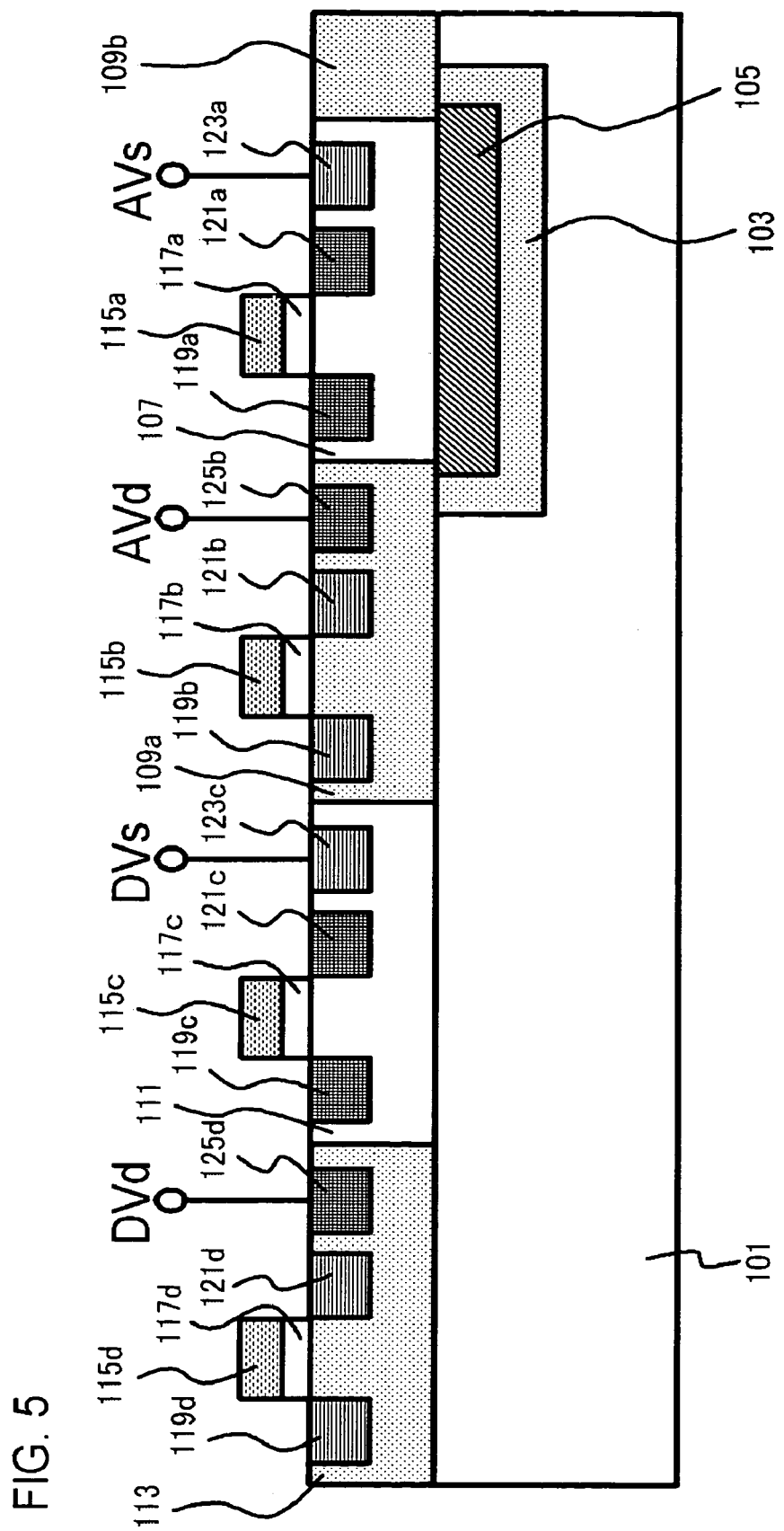
FIG. 5 is a schematic cross-sectional view showing a structure of a semiconductor device according to still another embodiment of the present invention.

FIG. 5 is a schematic cross-sectional view showing a structure of a semiconductor device according to this embodiment.

The semiconductor device according to this embodiment has a similar structure to that of the fourth embodiment, with the following additions. The constituents similar to those in the fourth embodiment are given the same numerals, and the description thereof will be omitted where appropriate.

In the semiconductor device according to this embodiment, the second deep n-type well 103 covers the lower and side faces of the first deep n-type well 105. In other words, a plurality of n-type wells 109a, 109b is provided, so that the end portions of the second deep n-type well 103 are joined to the lower face of the n-type wells 109a, 109b.

The following passages cover the advantageous effect of the semiconductor device according to this embodiment.

The semiconductor device according to this embodiment provides the following benefits, in addition to those provided by the semiconductor device of the fourth embodiment.

In the semiconductor device according to this embodiment, the second deep n-type well 103 receives a potential via the n-type wells 109a, 109b. Here, the n-type wells 109a, 109b are located along an upper face of an outer periphery of the first deep n-type well 105, and are overlapping in a plan view. The n-type wells 109a, 109b may be formed for example in a ring shape along the upper face of the outer periphery of the first deep n-type well 105. In other words, since the end portions of the second deep n-type well 103 are in contact with the lower face of the n-type wells 109a, 109b, the n-type wells 109a, 109b are electrically connected via the second deep n-type well 103. Consequently, the second deep n-type well 103 can stably receive a potential via both of the n-type wells 109a, 109b.

Sixth Embodiment

Figure 6:
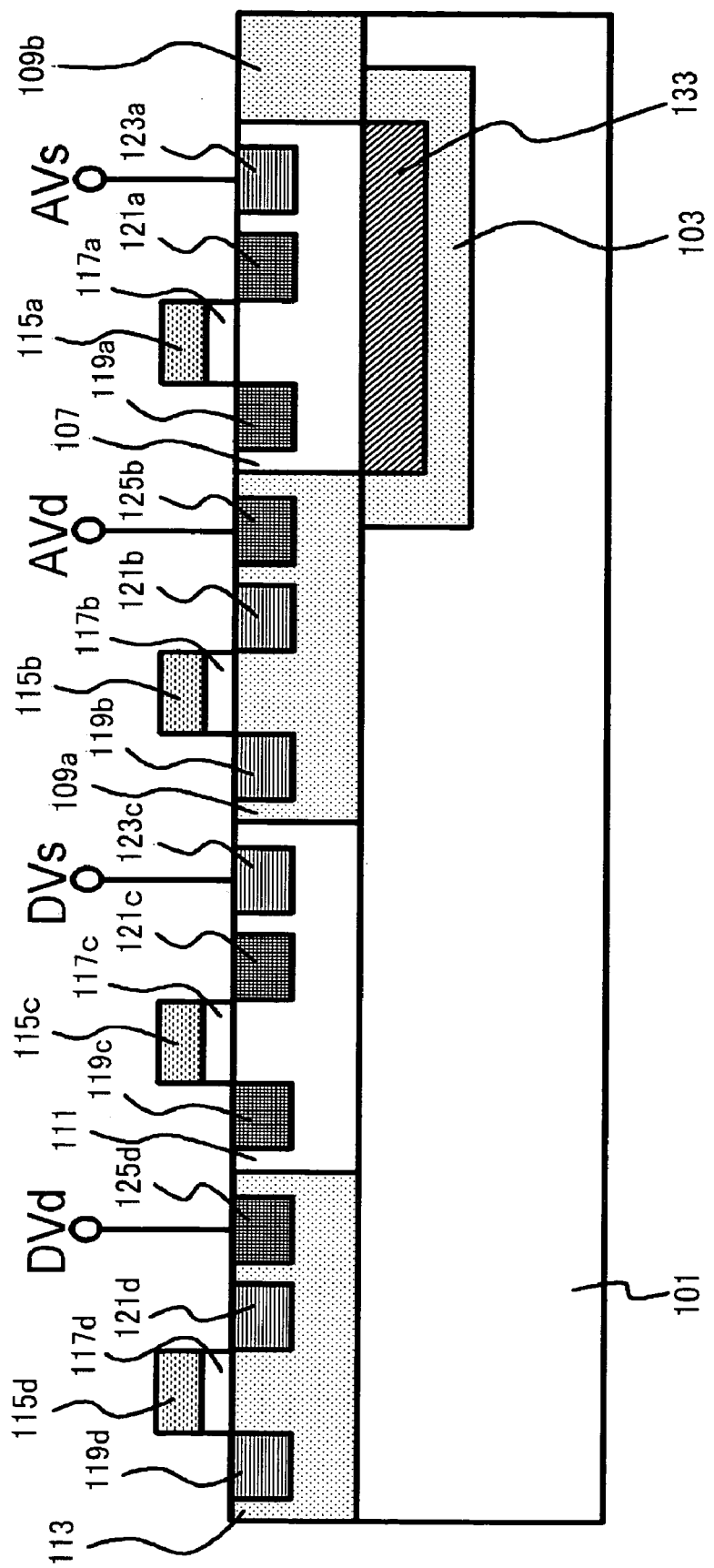
FIG. 6 is a schematic cross-sectional view showing a structure of a semiconductor device according to still another embodiment of the present invention.

FIG. 6 is a schematic cross-sectional view showing a structure of a semiconductor device according to this embodiment.

The semiconductor device according to this embodiment has a different structure from that of the first embodiment, in the following aspects. The constituents similar to those in the fourth embodiment are given the same numerals, and the description thereof will be omitted where appropriate.

In the semiconductor device according to this embodiment, the p-type well (the one-conductive first region) in the analog circuit includes the first p-type well 107 (the one-conductive first upper region, the fifth region) and the second p-type well 133 (the one-conductive second upper region, the fourth region) provided on the element formation surface of the p-type Si substrate 101. Also, the second p-type well 133 is located closer to the bottom side of the p-type Si substrate 101 than the first p-type well 107, and has a lower p-type impurity concentration than the first p-type well 107.

Further, the semiconductor device includes the deep n-type well 103 (the reverse-conductive third region) located closer to the bottom side of the p-type Si substrate 101 than the p-type well (the one-conductive first region). The deep n-type well 103 serves to isolate the p-type well (the one-conductive first region) from the bottom-side region of the p-type Si substrate 101.

The deep n-type well 103 covers the lower and side faces of the second p-type well 133, so as to be in contact with the n-type wells 109a, 109b.

The following passages cover the advantageous effect of the semiconductor device according to this embodiment.

The semiconductor device according to this embodiment suppresses the noise propagation between the digital circuit and the analog circuit. To be more detailed, since the impurity concentration of the second p-type well 133 is lower than the first p-type well 107, the depletion layer formed in the vicinity of the interface between the second p-type well 133 and deep n-type well 103 can be expanded. Therefore, the junction capacitance in the vicinity of this interface can be reduced. This leads to an increase in impedance in the vicinity of such interface. Consequently, the noise propagation via this interface is suppressed, which results in suppressing the noise propagation between the digital circuit and the analog circuit.

REFERENCE EXAMPLE

Figure 9:
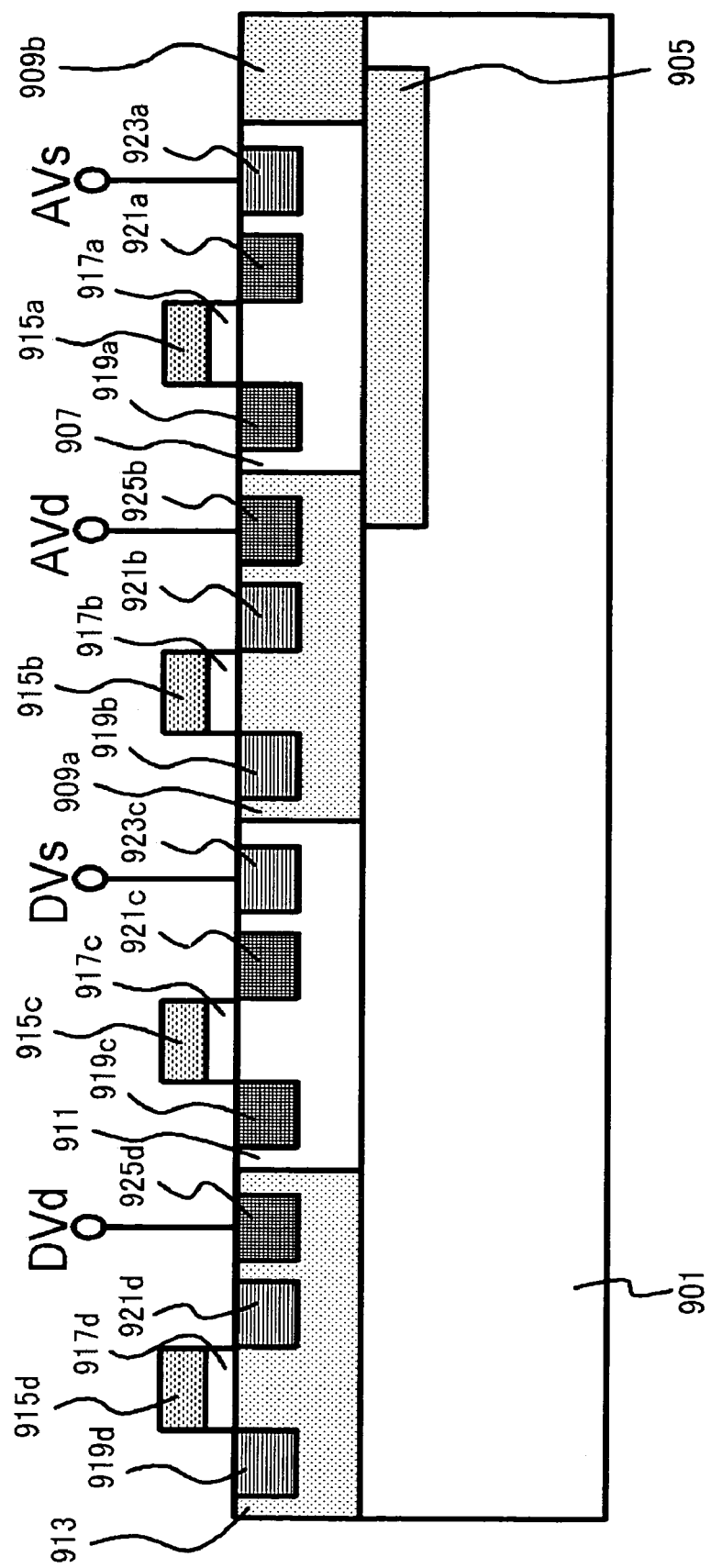
FIG. 9 is a schematic cross-sectional view showing a structure of a semiconductor device according to a reference example.

FIG. 9 is a schematic cross-sectional view showing a structure of a semiconductor device according to a reference example.

The semiconductor device according to this reference example has a different structure from that of the first embodiment, in the following aspects. Since the remaining portion of the structure is similar to the first embodiment, the description will be omitted where appropriate.

The semiconductor device according to the reference example includes a deep n-type well 905 right under a p-type well 907 constituting a part of an analog circuit, however the deep n-type well 905 is not constituted of double wells.

The following passages cover the drawbacks incidental to the semiconductor device according to the reference example.

In the semiconductor device according to the reference example, the deep n-type well 905 is not constituted of double wells. Accordingly, increasing the n-type impurity concentration of the deep n-type well 905 similarly to n-type wells 909a, 909b leads to a high impurity concentration of the deep n-type well 905 in the vicinity of the interface between the deep n-type well 905 and the p-type well 907, or in the vicinity of the interface between the deep n-type well 905 and the p-type bottom-side region of the p-type Si substrate 101, thus making it difficult to expand the depletion layer formed in the vicinity of these interfaces. This in turn makes it difficult to reduce the junction capacitance of these interfaces. Therefore, the impedance in the vicinity of the interface can readily drop. Consequently, it becomes difficult to suppress the noise propagation via these interfaces, and hence to suppress the noise propagation between the digital circuit and the analog circuit.

On the other hand, reducing the n-type impurity concentration of the deep n-type well 905 than the n-type wells 909a, 909b leads to an increase in resistance of the deep n-type well 905, thus making it difficult to supply a potential to the deep n-type well 905 via the n-type wells 909a, 909b.

In contrast, since the semiconductor device according to the first embodiment includes a double-well structure, then-type impurity concentration of one of the deep n-type wells can be increased, while reducing the n-type impurity concentration of the other of the deep n-type well. Accordingly, the depletion layer can be expanded by providing an interface between the deep n-type well having the lower n-type impurity concentration and the p-type bottom-side region Besides, a potential can be supplied to the deep n-type well having the higher n-type impurity concentration, via the potential of the n-type well.

Although the embodiments of the present invention have been described in details referring to the accompanying drawings, it is to be understood that those embodiments are only exemplary and that various other structures may be adopted.

To cite a few examples, while the double-structure deep n-type well including the first deep n-type well 105 and the second deep n-type well 103 is provided right under the p-type well 107 constituting a part of the analog circuit in the foregoing embodiment, the present invention is not limited to such structure. Providing, for example, a double-structure deep n-type well including the first deep n-type well 105 and the second deep n-type well 103 right under the p-type well 111 constituting a part of the digital circuit also achieves the similar advantageous effect.

Also, while the semiconductor device according to the foregoing embodiments includes the digital circuit and the analog circuit, the present invention is not limited to such structure. A semiconductor device including, for example, a SRAM circuit, an I/O circuit and a core circuit instead of the digital circuit and the analog circuit also achieves the similar advantageous effect.

Further, while the semiconductor device according to the foregoing embodiments includes the double-structure deep n-type well including the first deep n-type well 105 and the second deep n-type well 103, the present invention is not limited to such structure. Providing, for example, a triple-structure deep n-type well including a layer of the deep n-type well having a high n-type impurity concentration interposed between an upper and a lower layers of the deep n-type well having a low n-type impurity concentration also achieves the similar advantageous effect.

Further, while the first deep n-type well 105 and the second deep n-type well 103 contain a same n-type impurity according to the foregoing embodiments, the present invention is not limited to such structure. The first deep n-type well 105 and the second deep n-type well 103, for example, may contain different n-type impurities from each other.

It is apparent that the present invention is not limited to the above embodiment, that may be modified and changed without departing from the scope and spirit of the invention.

What is claimed is:

1. A semiconductor device comprising:
a semiconductor substrate having a first conductivity type;
a first element region formed at an element formation surface side of said semiconductor substrate; and
a second element region formed at said element formation surface side of said semiconductor substrate;
wherein said first element region includes:

a first region having said first conductivity type,
a second region having a second conductivity type opposite to said first conductivity type, and
a third region having said second conductivity type and being formed closer to a bottom side of said semiconductor substrate that is opposite said element formation surface side than said first region is to said bottom side, so as to isolate said first region from said bottom side of said semiconductor substrate; and
said third region includes:
a second conductivity type first lower region contacting a lower face of said first region, and
a second conductivity type second lower region formed closer to the bottom side of said semiconductor substrate than said first lower region and contacting a lower surface of said first lower region, and having an impurity concentration less than said first lower region.

2. The semiconductor device according to claim 1, wherein a lower face of said second lower region is joined to said semiconductor substrate.

3. The semiconductor device according to claim 1, wherein an upper face of said first lower region is joined to a lower face of said second region, and
said impurity concentration of said first lower region is lower than said impurity concentration of said second lower region.

4. The semiconductor device according to claim 1, wherein a plurality of said second regions is provided, and
said upper face of said first lower region is joined to said lower face of said plurality of said second regions.

5. The semiconductor device according to claim 1, wherein said first element region constitutes at least a part of one of said digital circuit and said analog circuit, and
said second element region constitutes at least a part of the other of said digital circuit and said analog circuit.

6. A semiconductor device comprising:
a semiconductor substrate of a first conductivity type;
a first element region formed at an element formation surface side of said semiconductor substrate; and
a second element region formed at said element formation surface side of said semiconductor substrate;
wherein said first element region includes:
a first region of said first conductivity type,
a second region of a second conductivity type that is opposite to said first conductivity type, and
a third region of said second conductivity type formed vertically between said semiconductor substrate and said first region, so as to isolate said first region from said semiconductor substrate; and
wherein said third region includes:
a first lower region having said second conductivity type contacting a lower surface of said first region, and
a second lower region formed between said semiconductor substrate and said first lower region and contacting a lower surface of said first lower region, and having an impurity concentration less than said first lower region.

7. A semiconductor device comprising:
a semiconductor substrate of a first conductivity type;
a first element region formed at an element formation surface side of said semiconductor substrate; and
a second element region formed at said element formation surface side of said semiconductor substrate;
wherein said first element region includes:
a first region of said first conductivity type,
a second region of a second conductivity type that is opposite said first conductivity type, and
a third region of said second conductivity type formed directly below said first region and covering an entirety of a lower surface of said first region, so as to isolate said first region from said semiconductor substrate; and
wherein said third region includes:
a first lower region having said second conductivity type contacting a lower surface of said first region, and
a second lower region formed between said semiconductor substrate and said first lower region and contacting a lower surface of said first lower region, and having an impurity concentration less than said first lower region.

* * * * *